(12) United States Patent
Suh et al.

(10) Patent No.: US 8,823,121 B2
(45) Date of Patent: Sep. 2, 2014

(54) WAVEGUIDE PHOTO-DETECTOR

(75) Inventors: Dongwoo Suh, Daejeon (KR);
Sanghoon Kim, Seoul (KR); Jiho Joo, Goyang (KR); Gyungock Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 109 days.

(21) Appl. No.: 13/550,364

(22) Filed: Jul. 16, 2012

(65) Prior Publication Data

US 2012/0280347 A1 Nov. 8, 2012

Related U.S. Application Data

(63) Continuation of application No. 12/763,990, filed on Apr. 20, 2010, now Pat. No. 8,242,571.

(30) Foreign Application Priority Data

Aug. 31, 2009 (KR) .................. 10-2009-0081339

(51) Int. Cl.
*H01L 31/00* (2006.01)
*G02B 6/12* (2006.01)
*H01L 31/0352* (2006.01)
*G02B 6/13* (2006.01)
*G02B 6/136* (2006.01)

(52) U.S. Cl.
CPC ........ *G02B 6/12004* (2013.01); *H01L 31/0352* (2013.01); *G02B 6/131* (2013.01); *G02B 6/136* (2013.01); *G02B 2006/121* (2013.01)
USPC ........................................ 257/431

(58) Field of Classification Search
CPC .... G02B 6/12004; G02B 6/131; G02B 6/136; H01L 31/0352; H01L 33/0232; H01L 31/02325; H01L 31/0232
USPC .......... 257/431, 432, 436, E31.127; 385/129, 385/130
See application file for complete search history.

(56) References Cited

U.S. PATENT DOCUMENTS

| | | | |
|---|---|---|---|
| 5,747,860 A * | 5/1998 | Sugiyama et al. ............ | 257/432 |
| 6,897,498 B2 * | 5/2005 | Gothoskar et al. ............ | 257/226 |
| 7,209,623 B2 * | 4/2007 | Morse .......................... | 385/131 |
| 7,305,157 B2 * | 12/2007 | Ahn et al. ..................... | 385/14 |
| 2010/0098424 A1 * | 4/2010 | Ho et al. ....................... | 398/116 |

FOREIGN PATENT DOCUMENTS

| | | |
|---|---|---|
| JP | 2004-349350 A | 12/2004 |
| JP | 2005-72273 A | 3/2005 |
| JP | 2009-117708 A | 5/2009 |
| KR | 10-2005-0025384 A | 3/2005 |

* cited by examiner

*Primary Examiner* — Nikolay Yushin (57) ABSTRACT

Provided is a waveguide photodetector that may improve an operation speed and increase or maximize productivity. The waveguide photodetector includes a waveguide layer extending in a first direction, an absorption layer disposed on the waveguide layer, a first electrode disposed on the absorption layer, a second electrode disposed on the waveguide layer, the second electrode being spaced from the first electrode and the absorption layer in a second direction crossing the first direction, and at least one bridge electrically connecting the absorption layer to the second electrode.

17 Claims, 11 Drawing Sheets

WAVEGUIDE PHOTO-DETECTOR

CROSS-REFERENCE TO RELATED APPLICATIONS

This U.S. non-provisional patent application claims priority under 35 U.S.C. §119 of Korean Patent Application No. 10-2009-0081339, filed on Aug. 31, 2009, the entire contents of which are hereby incorporated by reference.

BACKGROUND

The present disclosure herein relates to a waveguide photodetector, and more particularly, to a waveguide photodetector for detecting incident light traveling along a waveguide.

Waveguide photodetectors is devices in which incident light is coupled to an absorption layer by an optical coupling phenomenon such as an evanescent coupling or a radiation mode, and the light absorbed in the absorption layer is detected as current through an electro-optic conversion when the incident light traveling along a waveguide having a relative higher refractive index than a substrate meets an absorption layer having a refractive index less than that of the waveguide. The waveguide photodetectors have been used for integrated optical devices in which III-V compound semiconductors are mainly used. Waveguide photodetectors that use germanium (Ge) having a refractive index greater than that of upper silicon on a silicon-on-insulator (SOI) substrate as an absorption layer are now being developed.

SUMMARY OF THE INVENTIVE CONCEPT

Embodiments of the inventive concept provide a waveguide photodetector that may increase or maximize an operation speed of a device.

Embodiments of the inventive concept also provide a waveguide photodetector that may increase or maximize electrical characteristics of a doped layer connecting a waveguide layer disposed below an absorption layer to a waveguide layer disposed below a second electrode.

Embodiments of the inventive concept also provide a waveguide photodetector that may increase or maximize productivity by reducing the number of unit process and process costs for manufacturing an absorption layer.

Embodiments of the inventive concept provide waveguide photodetectors including: a waveguide layer extending in a first direction; an absorption layer disposed on the waveguide layer; a first electrode disposed on the absorption layer; a second electrode disposed on the waveguide layer, the second electrode being spaced from the first electrode and the absorption layer; and at least one bridge electrically connecting the absorption layer to the second electrode.

In some embodiments, the bridge may include the waveguide layer remaining between the plurality of trenches formed by removing the waveguide layer between the absorption layer and the second electrode by a predetermined depth. Here, the plurality of trenches is spaced a predetermined distance from each other along a circumference of the absorption. The waveguide layer remaining as each of protrusions of the plurality of trenches may correspond to the bridge. Also, the absorption layer and the second electrode may be separated by the plurality of trenches.

In other embodiments, the bridge may include a second doped layer in which a top surface of the waveguide layer is doped with conductive impurities. In this case, the second doped layer may electrically connect the absorption layer to the second electrode. Also, the bridge may include the waveguide layer in which an optical loss may occur from a lower side of the second doped layer toward a photo-detection region. However, the bridge improves conductivity.

In other embodiments, the second doped layer may extend toward the top surface of the waveguide layer disposed below the absorption layer and the second electrode. The second doped layer may be disposed between the waveguide layer and the absorption layer to provide ohmic contact therebetween. Thus, the second doped layer may be connected from a lower portion of the absorption layer to a lower portion of the second electrode via the bridge to form one line.

In even other embodiments, the waveguide photodetectors may further include a first doped layer between the absorption layer and the first electrode. The first doped layer may provide ohmic contact between the absorption layer and the first electrode. Thus, the first doped layer may be ohmic-contacted to an upper portion of the absorption layer, and the second doped layer may be ohmic-contacted to a lower portion of the absorption layer.

In yet other embodiments, the first doped layer may be doped with conductive impurities having a polarity opposite to that of the conductive impurities doped into the second doped layer. This may be done because flow directions of carriers moved through the first electrode and the second electrode electrically connected to both sides of the absorption layer are different from each other. That is, the stacked structure of the second doped layer 22, the absorption layer 30, and the first doped layer 32 may include a PN, NP, PIN, or NIP coupling structure.

In still further embodiments, the waveguide photodetectors may further include a passivation layer filled into the plurality of trenches. Incident light may be confined into the absorption layer using the passivation layer including a silicon oxide layer filled in the trench formed around a circumference of the waveguide layer disposed below the absorption layer formed of silicon having a high refractive index.

In even further embodiments, the second electrode may be disposed on the waveguide layer located in end of the bridge connected the waveguide layer disposed below the first electrode and the absorption layer. That is, the second electrode may be spaced from the absorption layer and the first electrode on both sides.

In yet further embodiments, the absorption layer may be formed of germanium. Since the absorption layer is formed of germanium having a refractive index greater than that of the waveguide layer formed of silicon, incident light may be easily absorbed.

In yet further embodiments, the waveguide layer may have a stepped portion having a height equal to a depth of each of the trenches. Since the waveguide layer may have the stepped portion disposed in a direction in which the incident light travels and the stepped portion may be formed together with the trenches, a separate unit process may not be required.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures:

FIGS. 6 through 11B are sectional views illustrating a process of manufacturing a waveguide photodetector according to an embodiment of the inventive concept.

DETAILED DESCRIPTION OF THE EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the specification, the dimensions of layers and regions are exaggerated for clarity of illustration. It will also be understood that when a layer (or film) is referred to as being 'on' another layer or substrate, it can be directly on the other layer or substrate, or intervening layers may also be present. Also, though terms like a first, a second, and a third are used to describe various regions and layers in various embodiments of the present invention, the regions and the layers are not limited to these terms. These terms are used only to tell one region or layer from another region or layer. Therefore, a layer referred to as a first layer in one embodiment can be referred to as a second layer in another embodiment. An embodiment described and exemplified herein includes a complementary embodiment thereof.

Figure 1:
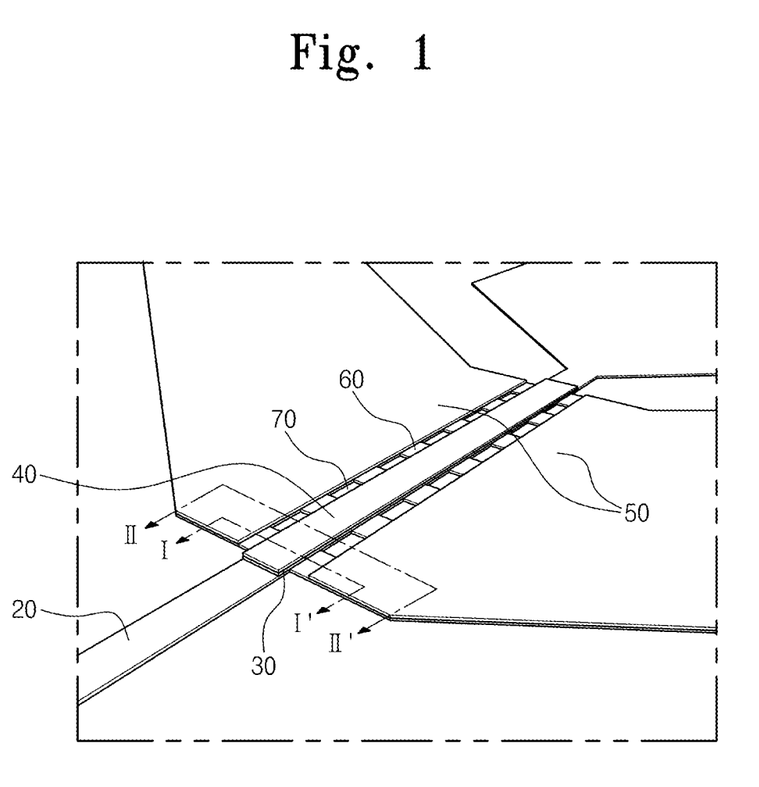
FIG. 1 is a perspective view of a waveguide photodetector according to an embodiment of the inventive concept.
Figure 2A:
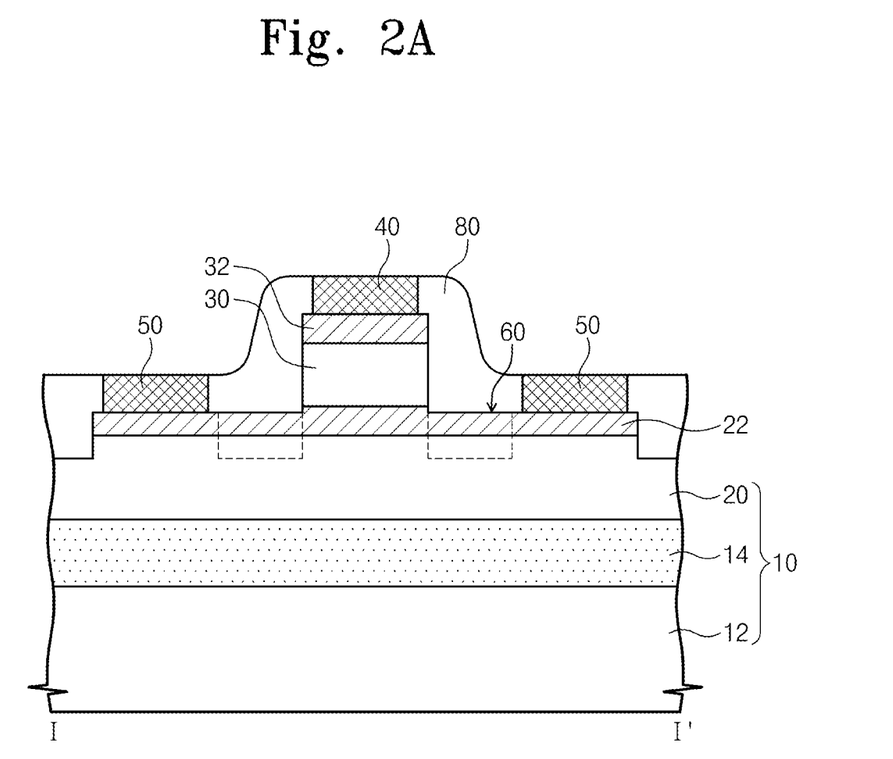
FIGS. 2A and 2B are sectional views taken along lines I-I' and II-II' of FIG. 1, respectively.
Figure 2B:
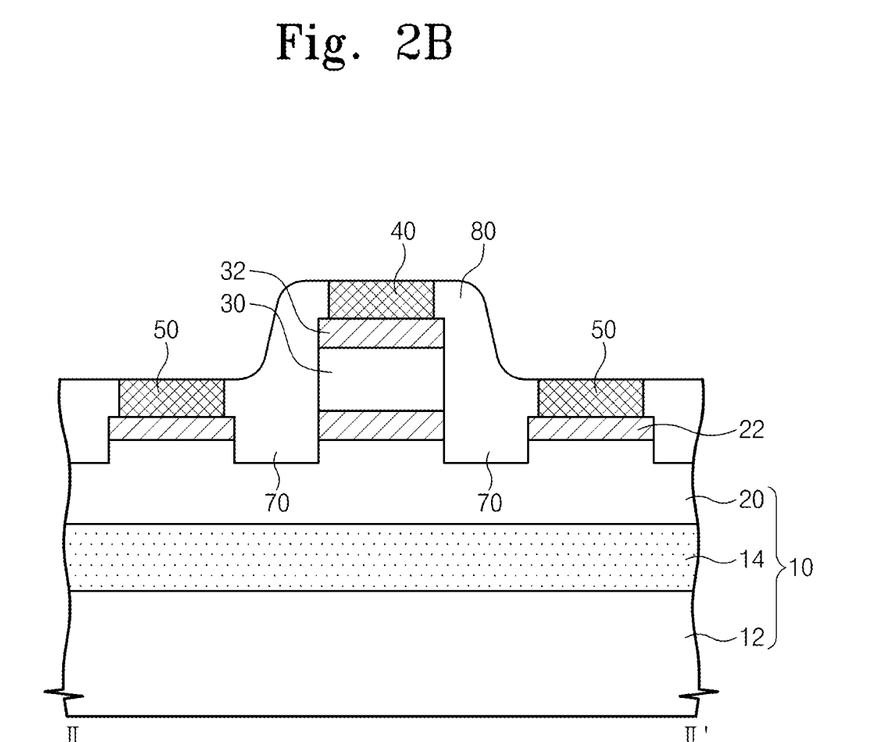

FIG. 1 is a perspective view of a waveguide photodetector according to an embodiment of the inventive concept, and FIGS. 2A and 2B are sectional views taken along lines I-I' and II-II' of FIG. 1, respectively;

Referring to FIGS. 1 through 2B, a waveguide photodetector according to an embodiment of the inventive concept includes an absorption layer 30, a first electrode 40, a second electrode 50, and a plurality of bridges 60. The absorption layer 30 and the first electrode 40 are stacked in one direction on a waveguide layer 20 through which incident light is transmitted. The second electrode 50 is spaced a predetermined distance or more from a circumference of the absorption layer 30. The plurality of bridges 60 electrically connects the second electrode 50 to the absorption layer 30.

The plurality of bridges 60 may be defined by a plurality of trenches 70, which is formed by removing the waveguide layer 20 to a predetermined depth between the second electrode 50 and the absorption layer 30. Thus, the bridges 60 correspond to protrusions between the trenches 70. For example, a second doped layer 22 doped with conductive impurities may be disposed in an upper protrusion between trenches 70, and the waveguide layer 20 formed of silicon may be disposed in a lower protrusion between trenches 70. Thus, each of the bridges 60 may have a mixed section in which the second doped layer 22 and the waveguide layer 20 exist together.

The second doped layer 22 may electrically connect the absorption layer 30 to the second electrode 50. Thus, since a lower portion of the absorption layer 30 is connected to a lower portion of the second electrode 50 through the bridge 60 to form one line, an operation speed of a device may be improved.

However, since the waveguide layer 20 existing from a lower side of the absorption 30 to a lower side of the second electrode 50 disperses the incident light traveling along the waveguide layer 20 disposed below the absorption layer 30, light losses may occur. When the bridge 60 increases in number and size, electrical characteristics are superior, but the light losses increase. The waveguide photodetector according to an embodiment of the inventive concept may be variously designed according to a change of number, size, shape, direction, and length of the bridge 60.

Light incident into the waveguide layer 20 may be easily transmitted in a direction in which a refractive index increases. The waveguide layer 20 may be formed of crystal silicon or poly silicon and disposed on a buried layer 14 disposed on a silicon substrate 12. The buried layer 14 may include an insulating layer including a silicon oxide layer having a refractive index less than that of the waveguide layer 20. The absorption layer 30 may be formed of germanium (Ge) having a refractive index greater than that of crystal silicon. The waveguide layer 20 may reduce incident light losses of the buried layer and transmit a large amount of incident light to the absorption layer 30. The buried layer 14 may be coupled to the silicon substrate 12 to form a silicon-on-insulator (SOI) substrate.

The second doped layer 22 may be disposed between the waveguide layer 20 and the absorption layer 30 to provide ohmic contact therebetween. Since the waveguide layer 20 disposed below the absorption layer 30 may allow the incident light to travel in a length direction of the absorption layer 30, the waveguide layer 20 may be formed in a rib type.

A second electrode 50 may be disposed on the waveguide layer 20 disposed at each of both ends of the plurality of trenches 70 and bridges 60. Dot lines illustrated in FIG. 2A represent the trenches 70. The second electrode 50 may be formed of a conductive metal such as aluminium. The waveguide layer 20 disposed below the absorption layer 30 and the waveguide layer 20 disposed below the second electrode 50 may be connected to each other through the bridge 60. As described above, the bridge 60 may include the second doped layer 22 formed along the upper protrusion between the plurality of trenches 70, and the waveguide layer 20 formed along the lower protrusion between the plurality of trenches 70.

The second doped layer 22 is disposed on the second electrode 50 and the absorption layer 30 to provide ohmic contact therebetween. That is, the bridge 60 may connect the second doped layer 22 from the lower portion of the absorption layer 30 to the lower portion of the second electrode 50 in a horizontal direction.

The absorption layer 30 absorbs the incident light coupled from the waveguide layer 20 and the second doped layer 22 to generate carriers. A first doped layer 32 and the first electrode 40 may be stacked on the absorption layer 30. The first doped layer 32 is disposed on the absorption layer 30 to provide ohmic contact between the absorption and the first electrode 40. The first doped layer 32 is doped with conductive impurities having a conductivity type opposite to that of the conductive impurities doped into the second doped layer 22. For example, the first doped layer 32 may be doped with n-type conductive impurities, and the second doped layer 22 may be doped with p-type conductive impurities, and vice versa. That is, the stacked structure of the second doped layer 22, the absorption layer 30, and the first doped layer 32 may include a PN, NP, PIN, or NIP coupling structure.

The first electrode 40 may be formed of a conductive metal such as aluminium. Thus, the first doped layer 32 and the first electrode 40, which are disposed on the absorption layer 30 may be electrically connected to each other, and the second doped layer 22 and the second electrode 50, which are disposed below the absorption layer 30 may be electrically connected to each other through the bridge 60. When a predetermined bias voltage is applied to the first electrode 40 and the second electrode 50, and the incident light is coupled to generate the carriers in the absorption layer 30, the bias voltage may be changed to generate electrical signals according to existence and nonexistence of the incident light.

A passivation layer 80 such as a silicon oxide layer covers an entire surface of a top surface of the substrate to expose the first electrode 40 and the second electrode 50. The passivation layer 80 may insulate the first electrode 40 from the second electrode 50 and reduce a loss of the incident light leaking through sidewalls of the waveguide layer 20 and the absorption layer 30 to improve electrical and optical characteristics. Furthermore, the passivation layer 80 may fill the inside of the trench 70 to reduce incident light dispersed around a circumference of the waveguide layer 20 disposed below the absorption layer 30 and confine the incident light into the absorption layer 30.

Thus, in the waveguide photodetector according to an embodiment of the inventive concept, the bridge 60 may be disposed between the absorption layer 30 and the second electrode 50 to improve the operation speed. The plurality of trenches 70 defining the bridges 60 may separate the waveguide layer 20 connected from the lower side of the absorption layer 30 to the lower side of the second electrode 50 to reduce the loss of the incident light dispersing in the waveguide layer 20. Also, the inside of the trench 70 may be filled with the passivation layer 80 to improve electrical property of the device.

Figure 3:
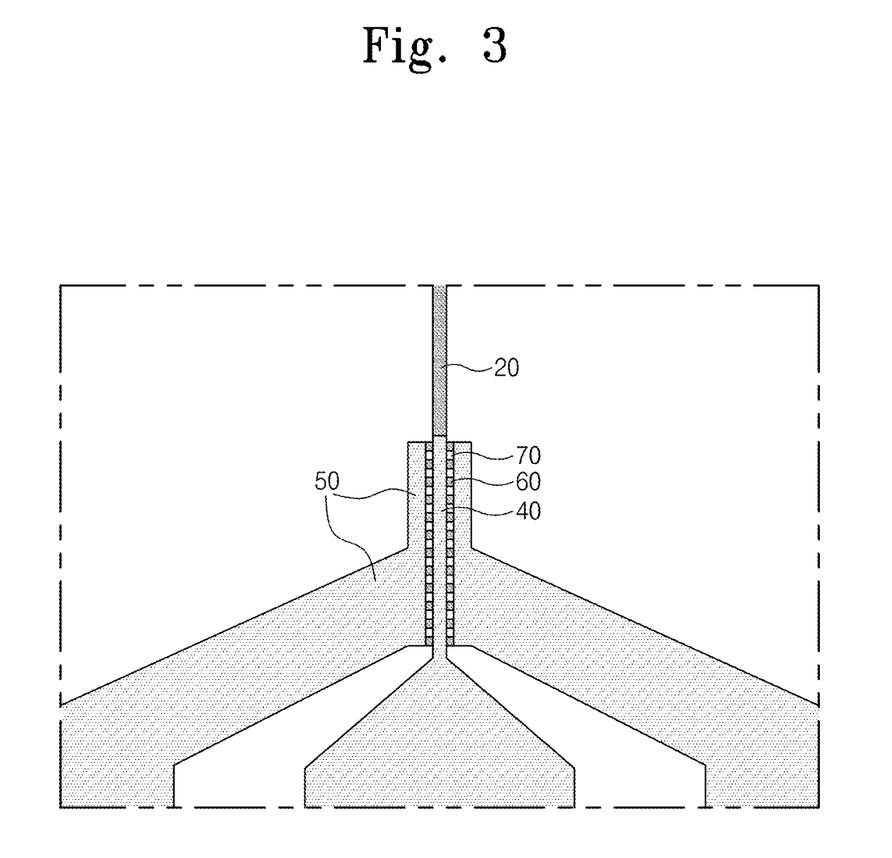
FIG. 3 is a view illustrating an actual configuration of a waveguide photodetector according to an embodiment of the inventive concept.

FIG. 3 is a view illustrating an actual configuration of a waveguide photodetector according to an embodiment of the inventive concept. The bridge 60 and the trench 70 between the first electrode 40 and the second electrode 50 are formed in the ratio of about 50:50. Although not shown, the absorption layer 30 disposed below the first electrode 40 corresponds to a photo-detection region. Also, the absorption layer 30 may have an area of about 8 mm width×50 mm length and a thickness of about 0.8 mm. The following experimental results may be obtained from the waveguide photodetector in which a mixed ratio of the bridge 60 to the trench 70 is equal to 50:50.

Figure 4:
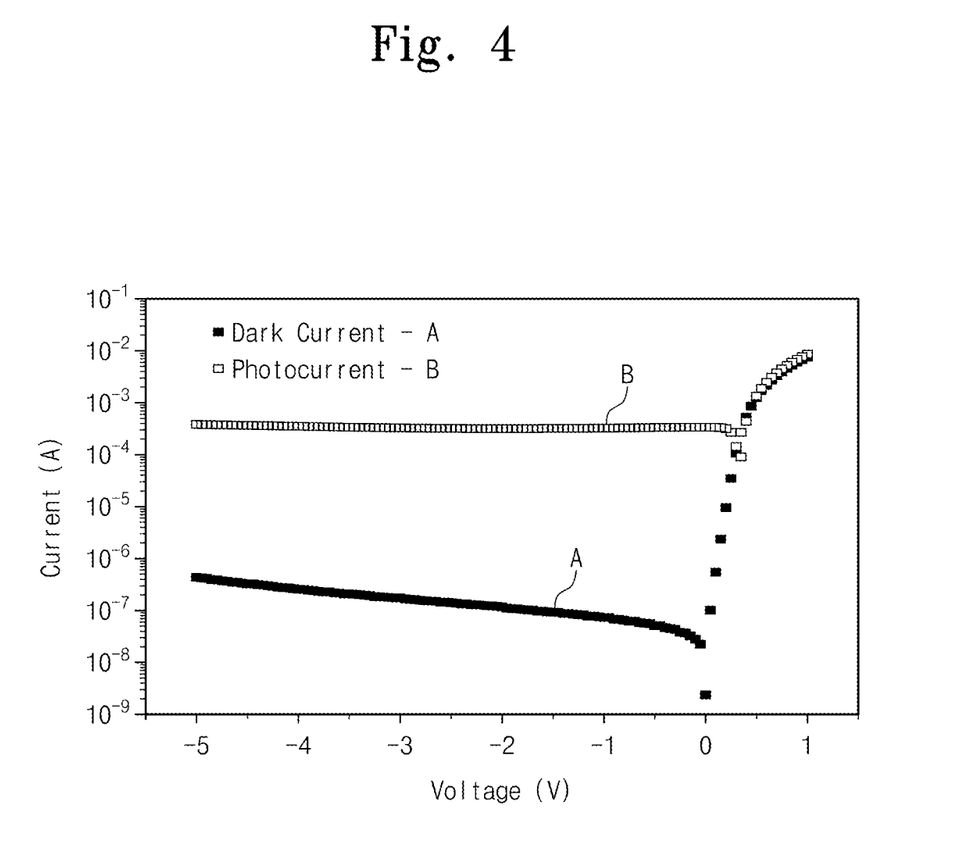
FIG. 4 is a graph of voltage-current characteristics obtained from a waveguide photodetector according to an embodiment of the inventive concept.

FIG. 4 is a graph of voltage-current characteristics obtained from a waveguide photodetector according to an embodiment of the inventive concept. A very low dark current A of about 92 nA was measured at a reverse-bias voltage of about 1 V. Here, the reverse-bias voltage represents that a reverse voltage is applied to a first conductive layer and a second conductive layer, which are doped with n-type and p-type impurities at upper and lower sides of the absorption 30, respectively. Very high photocurrent B of about 0.4 mA may be uniformly obtained using incident light having a wavelength of about 1.55 mm that is suitable for an optical communication band. When considering a coupling loss occurring in an optical fiber for supplying incident light to the waveguide layer 20 and a butt coupling structure of the waveguide layer 20, photocurrent as much as possible may be obtained in the waveguide photodetector according to an embodiment of the inventive concept.

Figure 5:
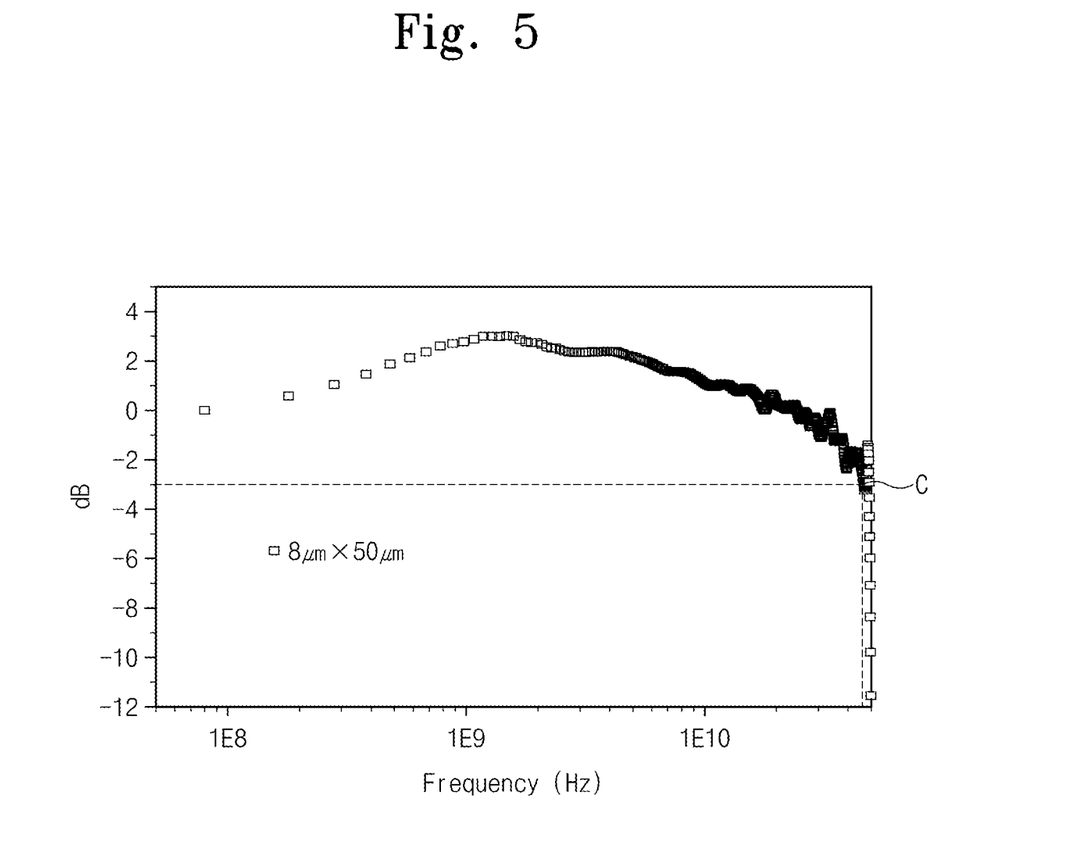
FIG. 5 is a graph of frequency-bandwidth characteristics obtained from a waveguide photodetector according to an embodiment of the inventive concept.

FIG. 5 is a graph of frequency response characteristic obtained from a waveguide photodetector according to an embodiment of the inventive concept. A 3-dB bandwidth C that is critical to the operation speed of the photodetector was measured up to about 47 GHz. Thus, it was obvious that the waveguide photodetector according to an embodiment of the inventive concept has an improved operation speed when compared with a typical device.

Hereinafter, a method of manufacturing the waveguide photodetector according to an embodiment of the inventive concept will be described.

FIGS. 6 through 11B are sectional views illustrating a process of manufacturing a waveguide photodetector according to an embodiment of the inventive concept.

Figure 6:
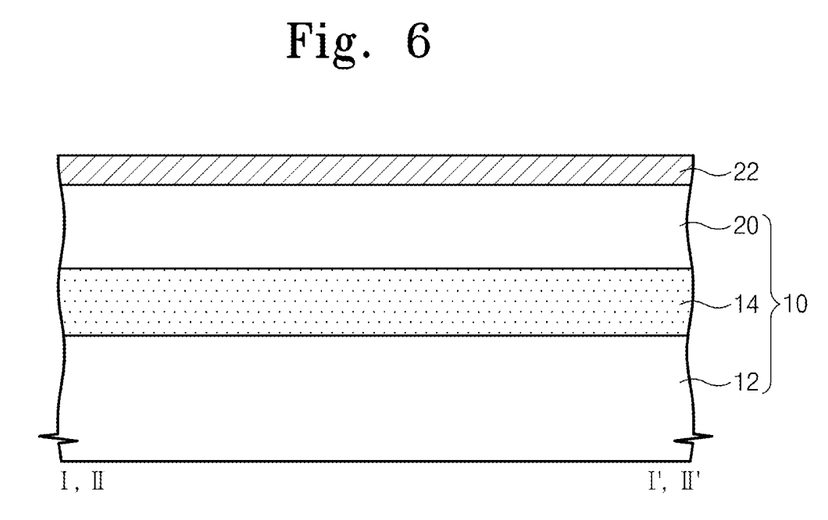

Referring to FIG. 6, A second doped layer 22 is formed on a SOI substrate 10 including a silicon substrate 12, a buried layer 14 and a waveguide layer 20. According to this embodiment, the waveguide layer 20 may be formed of crystal silicon or poly silicon. N-type conductive impurities may be doped into a top surface of the waveguide layer 20 to form the second doped layer 22. To improve electrical characteristics, the other type conductive impurities different from those of the second doped layer 22 may be thinly doped before the second doped layer 22 is formed.

Figure 7:
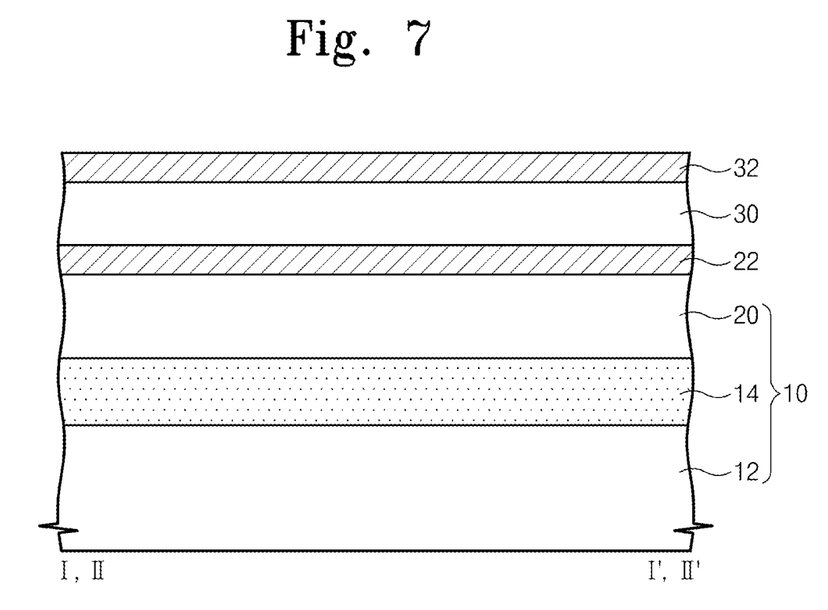

Referring to FIG. 7, an absorption layer 30 and a first doped layer 32 are sequentially formed on the second doped layer 22. According to this embodiment, the absorption layer 30 may be formed of Ge. In addition, the absorption layer 30 may be formed using an epitaxial growth method. According to an embodiment of the inventive concept, since the absorption layer 30 is formed using the general epitaxial growth method, manufacturing costs may be significantly reduced when compared to a typical SEG (Selective Epitaxial Growth) method. Conductive impurities may be in-situ doped into a top surface of the absorption layer 30 to form the first doped layer 32. Alternatively, a poly silicon layer doped with the conductive impurities may be disposed on the top surface of the absorption layer 30 to form the first doped layer 32.

Figure 8:
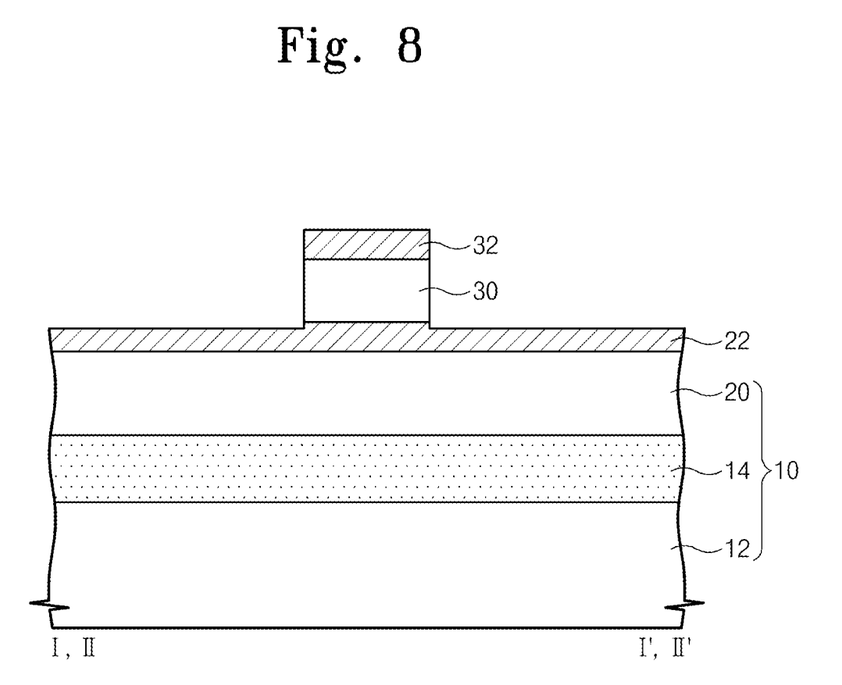

Referring to FIG. 8, the first doped layer 32 and the absorption layer 30 are patterned. According to this embodiment, the first doped layer 32 and the absorption layer 30 may extend in a first direction. When the first doped layer 32 and the absorption layer 30 are patterned, a top surface of the second doped layer 22 may be over-etched to form a height difference at a predetermined position. This is done because, in a succeeding process forming trenches 70 and bridges 60, the waveguide layer 20 formed below the absorption layer 30 ascends from bottom surfaces of the trenches 70 by a sufficient distance to further improve electrical characteristics of the rib type photodetector.

Figure 9A:
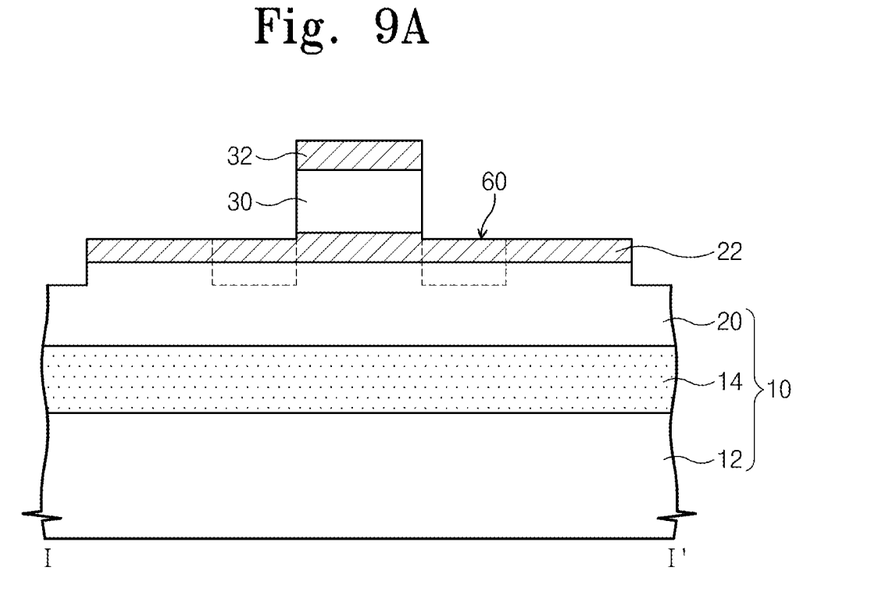
Figure 9B:
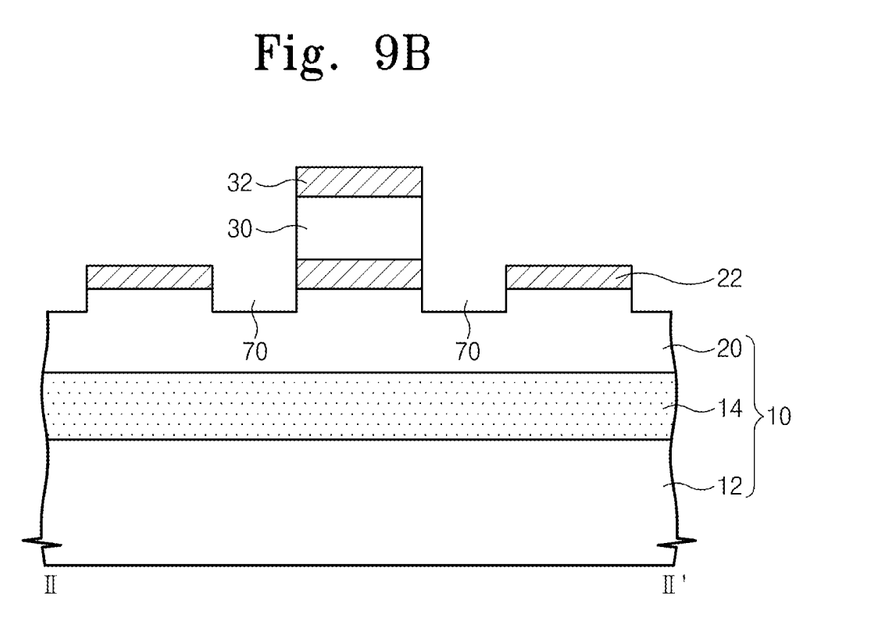

Referring to FIGS. 9A and 9B, the second doped layer 22 and the waveguide layer 20 disposed adjacent to a circumference of the absorption layer 30 are removed by a predetermined depth to form the plurality of trenches 70. According to this embodiment, the second doped layer 22 and the waveguide layer 20 remaining between the plurality of trenches 70 may be connected up to the second doped layer 22 and the waveguide layer 20 disposed below the absorption layer 30 in one line as the bridges 60. Here, for traveling of incident light, the waveguide layer 20 may be patterned to extend in the first direction. That is, the trenches 70 are formed to form the stepped waveguide layer 20 in a direction in which the incident light travels. Thus, since a separate unit process may not be required, productivity may be maximized.

As a result, in the method of manufacturing the waveguide photodetector according to an embodiment of the inventive concept, the plurality of trenches 70 may be formed around the absorption 30 to form the bridges 60 including the second doped layer 22 and the waveguide layer 20 remaining between the plurality of trenches 70.

Figure 10A:
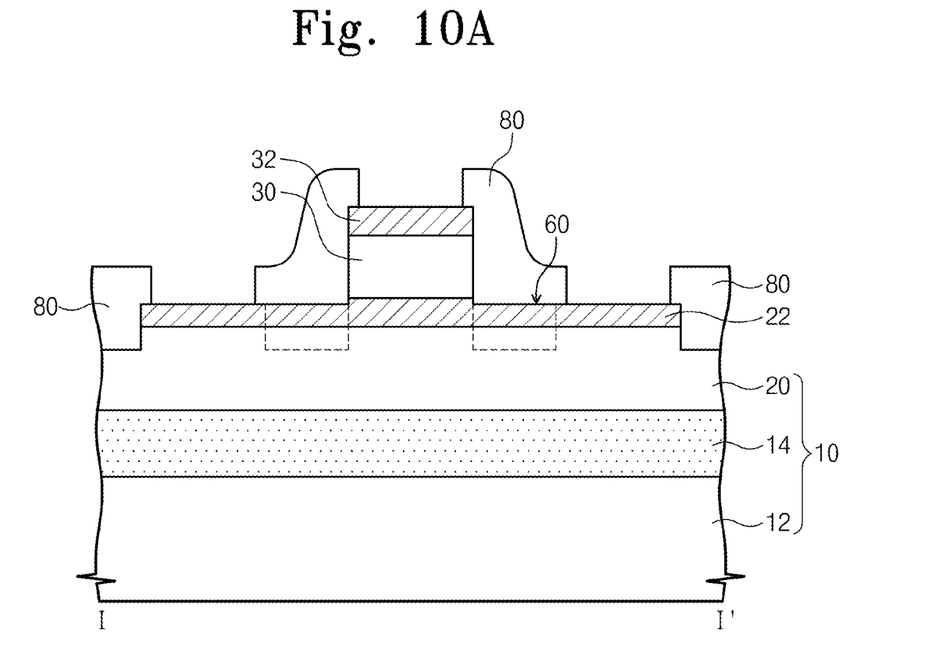
Figure 10B:
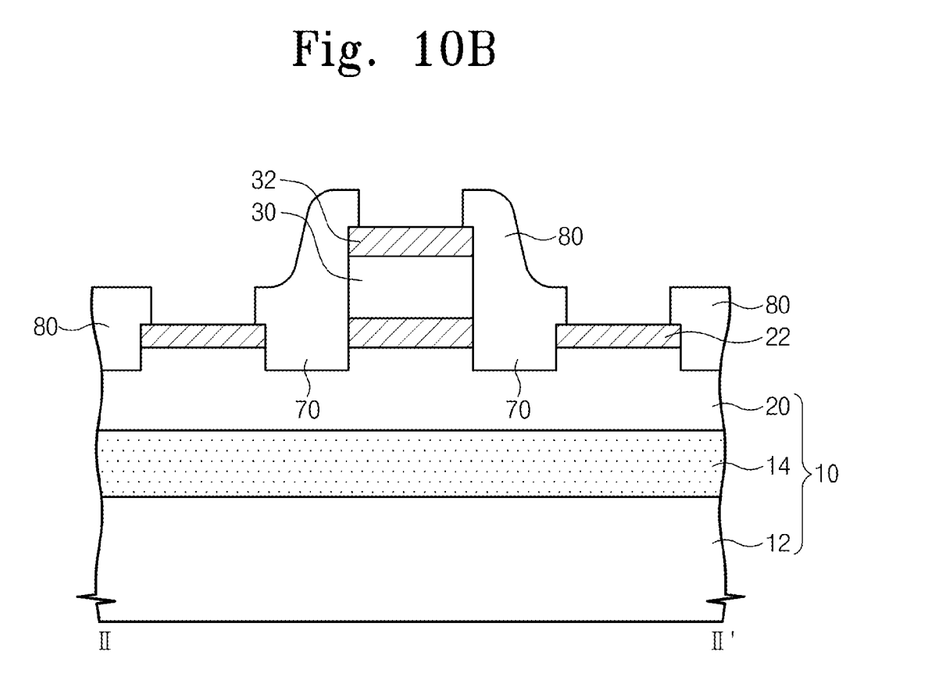

Referring to FIGS. 10A and 10B, a passivation layer 80 is formed on an entire surface of the SOI substrate 10. The passivation layer 80 is patterned to expose the second doped layer 22 and the first doped layer 32 except the bridges 60. The passivation layer 80 may cover lateral portions of the absorption layer 30 to reduce leakage of generated carrier. In addition, the passivation layer 80 may fill the inside of each of the trenches 70.

Figure 11A:
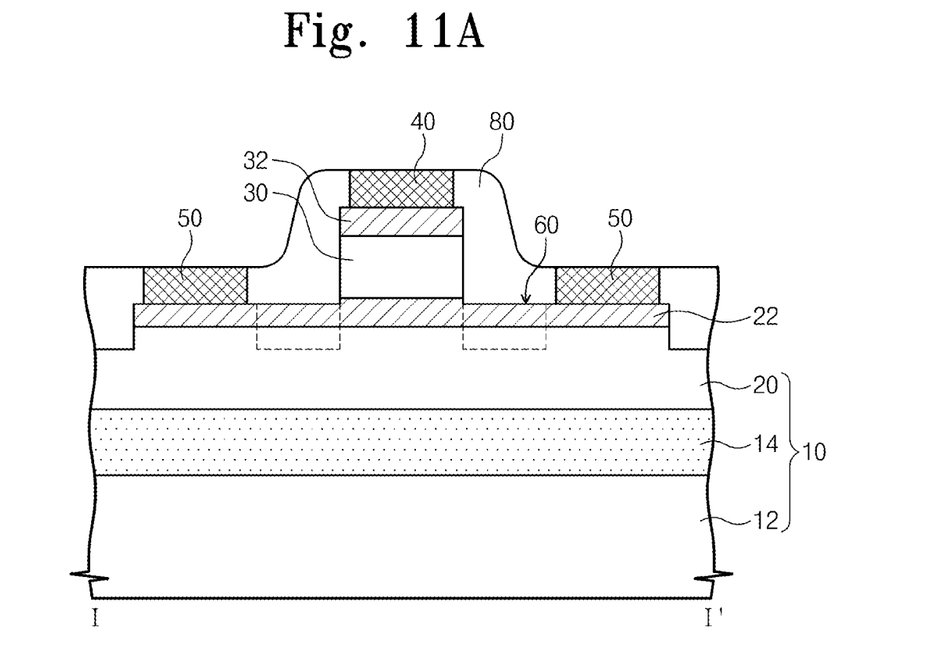
Figure 11B:
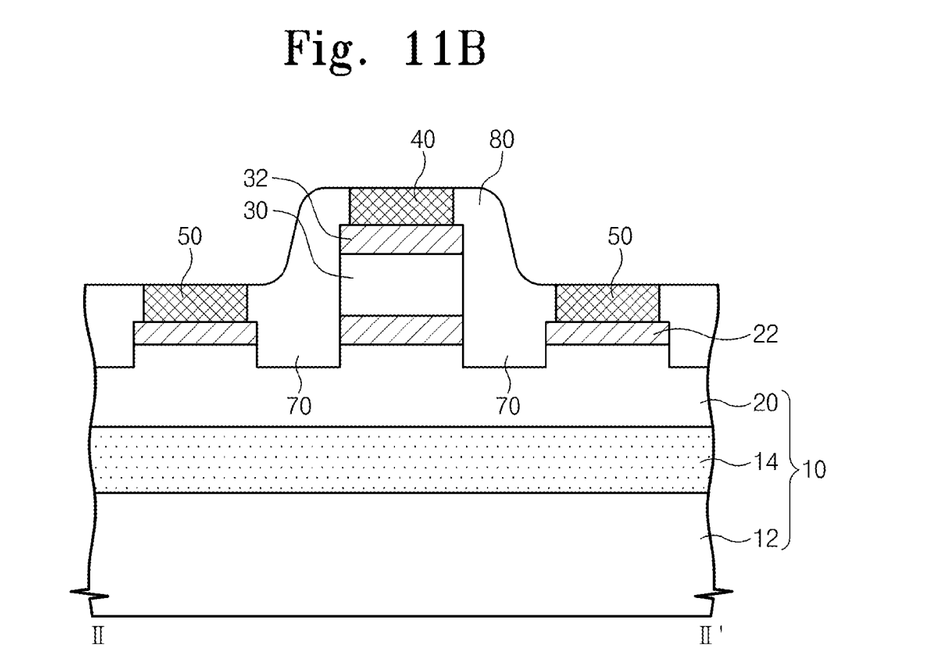

Referring to FIGS. 11A and 11B, a first electrode 40 and a second electrode 50 are formed on the first doped layer 32 and the second doped layer 22 exposed by the passivation layer 80, respectively. The first electrode 40 and the second electrode 50 may include a metal layer having a superior conductivity such as aluminium. The metal layer may be formed on the entire surface of the SOI substrate 10, and then, the metal layer formed on the passivation layer 80 may be removed to form the first electrode 40 and the second electrode 50 on the first doped layer 32 and the second doped layer 22, respectively.

Although not shown, in another embodiment of the inventive concept, trenches 70 and bridges 60 may be previously formed before an absorption layer 30 and a first doped layer 32 are formed. According to another embodiment, a waveguide layer 20 and a second doped layer 22 may be stacked, and then, portions of the second doped layer 22 and the waveguide layer 22 may be removed by a predetermined depth to form the plurality of trenches 70 and bridges 60. Then, the absorption layer 30 and the first doped layer 32 may be formed on the second doped layer 22 disposed on one side of the bridge 60. A first electrode 40 may be formed on the first doped layer 32, and a second electrode 50 may be formed on the second doped layer 22 disposed on the other side of the bridge 60. Thus, according to the other embodiment of the inventive concept, the trenches 70 and the bridges 60 may be previously formed, and then, the absorption layer 30, the first doped layer 32, and the first electrode 40 may be formed on the side of the bridge 60, and the second electrode 50 may be formed on the other side of the bridge 60.

As described above, in the waveguide photodetector according to the embodiments of the inventive concept, the operation speed of the device may increase. It will be understood by those skilled in the art that various changes in form and details may be easily made therein, based on the technical spirit of the inventive concept.

According to the embodiments of the inventive concept, the bridges electrically connected from the lower side of the absorption to the lower side of the second electrode may be utilized to improve or maximize the operation speed of the device.

Since the second doped layer of the bridge may be flatly connected from the lower side of the absorption layer to the lower side of the second electrode in one line, reliability of the second doped layer may be improved or maximized.

Since the trenches for forming the bridges are formed in the process of patterning the waveguide layer in which the incident light travels, the bridges may be formed without performing an additional process to improve or maximize the productivity.

Also, since the absorption layer to be formed on the waveguide layer may be formed using the patterning process to reduce the manufacturing costs when compared to a typical manufacturing process, the productivity may be improved or maximized.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A waveguide photodetector comprising:
   a waveguide layer;
   a first electrode and a second electrode on the waveguide layer; and
   an absorption layer between the first electrode and the waveguide layer,
   at least one bridge in an upper portion of the waveguide layer,
   wherein the waveguide layer includes at least one trench between the absorption layer and the second electrode,
   wherein the at least one trench includes a bottom surface lower than a top surface of the waveguide layer, and
   wherein the at least one bridge is defined by the at least one trench and protrudes from the bottom surface of the at least one trench.

2. The waveguide photodetector of claim 1, wherein the at least one trench comprises a sidewall defined by a sidewall of an upper portion of the waveguide layer.

3. The waveguide photodetector of claim 1, wherein the at least one bridge comprises a plurality of bridges,
   wherein the at least one trench comprises a plurality of trenches, and
   wherein the bridges and the trenches are alternately disposed between the first electrode and the second electrode.

4. The waveguide photodetector of claim 1, wherein the absorption layer comprises germanium.

5. The waveguide photodetector of claim 1, wherein the absorption layer and the waveguide layer extend in a first direction, and
   wherein the second electrode is spaced apart from the first electrode in a second direction crossing the first direction.

6. The waveguide photodetector of claim 5, wherein the second electrode comprises a plurality of second electrodes spaced apart in the second direction.

7. The waveguide photodetector of claim 1, further comprising a passivation layer filling the at least one trench.

8. The waveguide photodetector of claim 7, wherein a sidewall of the passivation layer contacts with first electrode.

9. The waveguide photodetector of claim 7, wherein the passivation layer comprises a silicon oxide layer.

10. The waveguide photodetector of claim 1, wherein the at least one bridge comprises a second doped layer in an upper portion thereof.

11. The waveguide photodetector of claim 10, wherein the second doped layer extends below the absorption layer and below the second electrode.

12. The waveguide photodetector of claim 11, further comprising a first doped layer between the absorption layer and the first electrode.

13. The waveguide photodetector of claim 12, wherein the first doped layer and the second doped layer have opposite conductivity type each other.

14. A waveguide photodetector comprising:
    a waveguide layer;
    a first electrode and a second electrode on the waveguide layer;
    an absorption layer between the first electrode and the waveguide layer;

a passivation layer extending from a sidewall of the absorption layer in a depth lower than a top surface of the waveguide layer,
wherein the passivation layer fills at least one trench in an upper portion of the waveguide layer, the at least one trench being recessed from the top surface of the waveguide layer,
wherein the absorption layer extends in a first direction, and
wherein the at least one trench includes a plurality of trenches spaced apart from each other in the first direction.

15. The waveguide photodetector of claim 14, wherein the plurality of trenches are spaced apart from each other by a plurality of bridges therebetween, and
wherein each of the plurality of bridges includes a doped region in an upper portion thereof, the doped region extends extending below the first electrode and below the second electrode.

16. The waveguide photodetector of claim 14, wherein the passivation layer exposes a top surface of the first electrode.

17. A waveguide photodetector comprising:
a waveguide layer;
a first electrode extending in a first direction on the waveguide layer;
a second electrode spaced apart from the first electrode in a second direction crossing the first direction on the waveguide layer;
an absorption layer between the first electrode and the waveguide layer; and
a doped layer between the absorption layer and the waveguide layer, and between the second electrode and the waveguide layer;
wherein the waveguide layer includes:
a plurality of trenches between the second electrode and the absorption layer, the plurality of trenches defined by a sidewall of the doped layer and the sidewall of an upper portion of the waveguide layer; and
a plurality of protruding portions between the plurality of trenches, the plurality of protruding portions protruding from bottom surfaces of the plurality of trenches.

* * * * *